US008871660B2

(12) United States Patent
Yoshizaki et al.

(10) Patent No.: US 8,871,660 B2
(45) Date of Patent: Oct. 28, 2014

(54) LAMINATED BODY, CIRCUIT BOARD INCLUDING LAMINATED BODY, SEMICONDUCTOR PACKAGE AND PROCESS FOR MANUFACTURING LAMINATED BODY

(75) Inventors: Kazuyuki Yoshizaki, Tokyo (JP); Teppei Ito, Tokyo (JP); Iji Onozuka, Tokyo (JP); Kensuke Nakamura, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 941 days.

(21) Appl. No.: 12/523,320

(22) PCT Filed: Feb. 7, 2008

(86) PCT No.: PCT/JP2008/000168
§ 371 (c)(1),
(2), (4) Date: Jul. 16, 2009

(87) PCT Pub. No.: WO2008/096540
PCT Pub. Date: Aug. 14, 2008

(65) Prior Publication Data
US 2010/0078201 A1 Apr. 1, 2010

(30) Foreign Application Priority Data

Feb. 8, 2007 (JP) .................................. 2007-029002
Feb. 28, 2007 (JP) .................................. 2007-049090

(51) Int. Cl.
*B32B 15/14* (2006.01)
*B32B 27/38* (2006.01)
*D03D 13/00* (2006.01)
*B32B 5/08* (2006.01)
*B32B 5/26* (2006.01)
*H05K 1/03* (2006.01)
*D04H 13/00* (2006.01)
*B29C 65/00* (2006.01)
*B32B 5/28* (2006.01)
*B32B 5/12* (2006.01)
*H05K 1/02* (2006.01)

(52) U.S. Cl.
CPC ................ *H05K 1/0366* (2013.01); *B32B 5/26* (2013.01); *H05K 2201/029* (2013.01); *B32B 5/28* (2013.01); *H05K 2201/09136* (2013.01); *B32B 5/12* (2013.01); *H05K 1/0271* (2013.01); *H05K 1/036* (2013.01)
USPC ........... 442/238; 442/175; 442/203; 442/218; 442/232; 442/234; 442/242; 174/255; 156/60; 156/148; 156/182

(58) Field of Classification Search
USPC ......... 442/203, 239, 242, 175, 218, 232, 234, 442/238; 174/255; 156/60, 148, 182
See application file for complete search history.

(56) References Cited

U.S. PATENT DOCUMENTS 4,943,334 A    7/1990  Medney et al.
5,100,713 A *  3/1992  Homma et al. ............... 442/203
(Continued)

FOREIGN PATENT DOCUMENTS

JP    62-292428    12/1987
JP    04-259543    9/1992
(Continued)

OTHER PUBLICATIONS

Japanese Office Action for corresponding JP Application No. 2008-557025, Jun. 5, 2012.

(Continued)

*Primary Examiner* — Jeremy R Pierce
(74) *Attorney, Agent, or Firm* — Ditthavong & Steiner, P.C.

(57) ABSTRACT

There is provided a laminated body comprising a first resin layer consisting of a first fibrous base material and a resin and a second resin layer consisting of a second fibrous base material and a resin, wherein the first resin layer and the second resin layer are disposed such that the first resin layer and the second resin layer are at least partly positioned in separate regions separated by the center line in a thickness direction of the laminated body; wherein at least one of the first fibrous base material and the second fibrous base material has a bowing region where a bowing region is a region in which a smaller warp/weft crossing angle is less than 90° in the fibrous base material; and wherein in the bowing region, an angle formed by a warp of the first fibrous base material and a warp of the second fibrous base material and an angle formed by a weft of the first fibrous base material and a weft of the second fibrous base material, whichever is larger, is 2° or less.

19 Claims, 8 Drawing Sheets

(56) References Cited

U.S. PATENT DOCUMENTS

| | | | |
|---|---|---|---|
| 6,197,149 B1 * | 3/2001 | Kobayashi et al. | 428/301.4 |
| 2003/0211797 A1 * | 11/2003 | Hill et al. | 442/205 |
| 2005/0003199 A1 * | 1/2005 | Takaya et al. | 428/413 |
| 2008/0190651 A1 * | 8/2008 | Klamminger et al. | 174/250 |

FOREIGN PATENT DOCUMENTS

| | | |
|---|---|---|
| JP | 05-111916 | 5/1993 |
| JP | 06-179244 | 6/1994 |
| JP | 2003-033991 | 2/2003 |
| JP | 2003-183982 | 7/2003 |
| JP | 2004-100052 | 4/2004 |
| JP | 2007-009217 | 1/2007 |

OTHER PUBLICATIONS

Korean Office Action for corresponding KR Application No. 10-2009-7017331, Feb. 18, 2014.

* cited by examiner (a)

(b)

LAMINATED BODY, CIRCUIT BOARD INCLUDING LAMINATED BODY, SEMICONDUCTOR PACKAGE AND PROCESS FOR MANUFACTURING LAMINATED BODY

TECHNICAL FIELD

The present invention relates to a laminated body, a circuit board with a laminated body, a semiconductor package and a process for manufacturing a laminated body.

BACKGROUND ART

Recent requirements for higher functions and reduction in a weight and a size in electronics have accelerated high-density integration and high-density mounting of electronic components. There is, however, a problem that a highly multilayered structure associated with high-density integration and mounting leads to increase an overall thickness of a multilayer printed wiring board. Thus, there has been devised a technique that a thinner glass cloth or resin layer is employed to make a core substrate thinner.

A core base material of a common semiconductor package is a laminated body including a plated material prepared by impregnating a fibrous base material (for example, a glass cloth) with a resin and semi-curing (so-called prepreg). Currently-used core materials predominantly have a thickness of about 0.8 mm. Recently, a thickness of a core substrate has been increasingly reduced because of requirement for reduction in a weight and a size, cost reduction for a substrate such as cost reduction for members and processing and improvement in electric properties. Recently, there have been developed semiconductor packages with a core material having a thickness of about 0.4 mm and 0.2 mm or less and furthermore without a core.

However, there have been sometimes restrictions to a circuit wiring pattern due to, for example, warpage generating in a core substrate. Approaches for solving such a problem have been disclosed in, for example, the following references. Patent Reference 1 has disclosed that warpage and torsion in a prepreg can be reduced by controlling a horizontal to vertical ratio of tensile strength of an unwoven glass fabric within a predetermined range. Patent Reference 2 relates to a process for manufacturing a laminated plate for a printed circuit consisting of a surface layer and intermediate layer with a reduced warpage. In such a process, horizontal/vertical balance is optimized by controlling difference between the numbers of fibers in a woven glass fabric used for a surface layer and a strength ratio of an unwoven glass fabric used for an intermediate layer.

Patent Reference 1: Japanese Published Unexamined Application No. 1987-292428;
Patent Reference 2: Japanese Published Unexamined Application No. 1992-259543.

DISCLOSURE OF THE INVENTION

A resin-impregnated laminated body with fibers such as a glass cloth as a base material has excellent rigidity and is suitable for the use as a thin core base material. However, as a core substrate has been thinner, the problem of a warpage in a conventional core substrate has become more significant. A thinner core substrate tends to result in a larger warpage, which leads to the problems of increase in a warpage of a core itself and increase in a warpage of a package caused by the increase in a warpage of a core.

Here, during producing a fibrous base material, there may be formed a bowing region in the fibrous base material, where an angle between warf and weft in the fibrous base material deviates from a certain angle. However, attention has been little focused on the presence of such a bowing region. We have found that when two or more fibrous base materials are laminated, the presence of the bowing region causes misalignment between overlapped fibers, which finally influences warpage in a core material. Therefore, it is essential to control the misalignment for preventing warpage in a thin core material. The above patent applications do not pay attention to the presence of a bowing region in a fibrous base material and thus has not yet solve the problem of warpage caused by thinning a core material.

In view of the situation described above, the present invention provides a laminated body with a reduced warpage by controlling misalignment between overlapped fibers in a fibrous base material, a circuit board having a laminated body, a semiconductor package and a process for manufacturing a laminated body.

The present invention is based on the observation that a warpage in a laminated body can be reduced by reducing a misalignment between fibers due to bowing, paying attention to the presence of a bowing in a fibrous base material.

The present invention provides the followings.

[1] A laminated body comprising a first resin layer including a first fibrous base material and a resin and a second resin layer including a second fibrous base material and a resin, wherein said first resin layer and said second resin layer are disposed such that at least a part of said first resin layer and at least a part of said second resin layer are positioned in separate regions separated by the center line in a thickness direction of said laminated body;

wherein at least one of said first fibrous base material and said second fibrous base material has a bowing region where a bowing region is a region in which a smaller warp/weft crossing angle is less than 89° in said fibrous base material; and wherein in said bowing region, the larger angle among an angle formed by a warp of said first fibrous base material and a warp of said second fibrous base material and an angle formed by a weft of said first fibrous base material and a weft of said second fibrous base material is 2° or less.

[2] The laminated body as described in [1], wherein the first and the second resin layers are substantially symmetrically disposed among the center line in a thickness direction of said laminated body.

[3] The laminated body as described in [1] or [2], wherein the first and the second resin layers are the outermost layers in the laminated body.

[4] The laminated body as described in any of [1] to [3], wherein all of the fibrous base materials contained in said laminated body comprise a bowing region, and between the fibrous base materials, an angle formed by warps of these fibrous base materials and an angle formed by wefts of these fibrous base materials, whichever is larger, is 2° or less for all the fibrous base materials.

[5] The laminated body as described in any of [1] to [4], wherein a thickness of the laminated body is 0.2 mm or less.

[6] The laminated body as described in any of [1] to [5], wherein a linear expansion coefficient of the laminated body in a planar direction is 2 ppm/° C. or more and 20 ppm/° C. or less.

[7] The laminated body as described in any of [1] to [5], wherein assuming that for said laminated body, an elastic modulus at 30° C. is A [GPa] and an elastic modulus at 180° C. is B [GPa], the equation is formed.

$$0.05 \leq (A-B)/A \leq 0.5$$

[8] The laminated body as described in any of [1] to [7], wherein the fibrous base material is a glass cloth.

[9] The laminated body as described in any of [1] to [8], wherein a thickness of the fibrous base material is 0.01 mm or more and 0.15 mm or less.

[10] A laminated body with a metal foil comprising the laminated body as described in any of [1] to [9], and a metal foil on at least one surface of said laminated body.

[11] The laminated body with a metal foil as described in [10], wherein said metal foil is a copper foil.

[12] A circuit board comprising the laminated body as described in any of [1] to [11].

[13] A semiconductor package, wherein a semiconductor device is mounted on the circuit board as described in [12].

The present invention also provides:

[14] A process for manufacturing a laminated body, comprising the steps of:

providing a first resin layer including a first fibrous base material and a resin and a second resin layer including a second fibrous base material and a resin;

disposing said first resin layer and said second resin layer such that at least a part of said first resin layer and at least a part of said second resin layer are positioned in separate regions separated by the center line in a thickness direction of said laminated body;

laminating said first resin layer and said second resin layer directly or via another layer; and heating and pressing said first resin layer and said second resin layer to form a laminated body, wherein at least one of said first fibrous base material and said second fibrous base material has a bowing region, where a bowing region is a region in which a smaller warp/weft crossing angle is less than 89° in said fibrous base material;

wherein in the step of laminating said first resin layer and said second resin layer, said first resin layer and said second resin layer are laminated such that in said bowing region, the larger angle among an angle formed by a warp of said first fibrous base material and a warp of said second fibrous base material and an angle formed by a weft of said first fibrous base material and a weft of said second fibrous base material is 2° or less.

The present invention further provides the followings:

[15] A laminated body comprising a first resin layer comprising a first fibrous base material formed by crossing warps and wefts and a resin and a second resin layer comprising a second fibrous base material formed by crossing warps and wefts and a resin, wherein said first resin layer and said second resin layer are disposed such that at least a part of said first resin layer and at least a part of said second resin layer are disposed in separate regions separated by the center line passed through the central point of the thickness of said laminated body and perpendicular to the lamination direction of said laminated body, wherein at least one of said first fibrous base material and said second fibrous base material has a bowing region in which a smaller weft/warp crossing angle is less than 90°, and wherein in a plan view of said laminated body from the surface side of said first resin layer, an angle formed by a warp of said first fibrous base material and a warp of said second fibrous base material and an angle formed by a weft of said first fibrous base material and a weft of said second fibrous base material are 2° or less within said bowing region.

[16] The laminated body as described in any of [1] to [9] and [15], wherein in a plan view of said laminated body, in the regions other than said bowing region, a warp of said first fibrous base material and a warp of said second fibrous base material are aligned in their extension direction and mutually parallel and a weft of said first fibrous base material and a weft of said second fibrous base material are aligned in their extension direction and mutually parallel.

[17] A process for manufacturing a laminated body, comprising the steps of:

providing a first resin layer including a first fibrous base material and a resin and a second resin layer including a second fibrous base material and a resin;

disposing said first resin layer and said second resin layer such that at least a part of said first resin layer and at least a part of said second resin layer are disposed in separate regions separated by the center line passed through the central point of the thickness of said laminated body and perpendicular to the lamination direction of said laminated body, laminating said first resin layer and said second resin layer directly or via another layer; and heating and pressing said first resin layer and said second resin layer to form a laminated body, wherein at least one of said first fibrous base material and said second fibrous base material has a bowing region in which a smaller weft/warp crossing angle is less than 90°, wherein in the step of laminating said first resin layer and said second resin layer, said first resin layer and said second resin layer are laminated such that in a plan view from the surface side of said first resin layer, an angle formed by a warp of said first fibrous base material and a warp of said second fibrous base material and an angle formed by a weft said first fibrous base material and a weft of said second fibrous base material are 2° or less within said bowing region.

In the above manufacturing processes of the present invention, fibrous base materials are laminated such that misalignment of fibers between the fibrous base materials is reduced, to minimize a warpage in a laminated body as a final product.

Briefly, the present invention provides a process for manufacturing a laminated body where a warpage is minimized. In the process of the present invention, when laminating two or more fibrous base materials, misalignment of fibers can be controlled to minimize a warpage in a laminated body itself as a final product. Furthermore, the present invention provides a laminated body where a warpage is minimized. A laminated body according to the present invention is suitable for a thin core material in a semiconductor package.

BRIEF DESCRIPTION OF THE DRAWINGS

The above-mentioned objectives as well as other objectives, features and advantages will be further understood with reference to the preferred embodiments described below and the following accompanied drawings.

BEST MODE FOR CARRYING OUT THE INVENTION

There will be detailed a laminated body of this embodiment.

First, a laminated body of this embodiment will be generally described.

A laminated body of this embodiment has a first resin layer containing a first fibrous base material formed by warps and wefts and a resin and a second resin layer containing a second fibrous base material formed by warps and wefts and a resin.

The first resin layer and the second resin layer are disposed such that at least a part of the first resin layer and at least a part of the second resin layer are disposed in separate regions separated by the center line that pass through the central point of the thickness of the laminated body (a central line in a thickness direction, Line a in FIG. 1) and that is perpendicular to the lamination direction of the laminated body.

At least one of the first fibrous base material and the second fibrous base material has a bowing region in which a smaller weft/warp crossing angle is less than 90°

In a plan view of the laminated body from the surface side of the first resin layer, an angle formed by a warp of the first fibrous base material and a warp of the second fibrous base material (when warps mutually cross, a smaller angle of those formed by the warps) and an angle formed by a weft of the first fibrous base material and a weft of the second fibrous base material (when wefts mutually cross, a smaller angle of those formed by the wefts) are 2° or less within the bowing region.

Herein, Each of warp and weft in a fibrous base material is a bundle of multiple fibers (yarn).

A fibrous base material is a product prepared by weaving warps and wefts by any of plain weaving, diagonal weaving and satin weaving.

Furthermore, an angle formed by warps of the first fibrous base material and of the second fibrous base material and an angle formed by wefts of the first fibrous base material and of the second fibrous base material may be 2° or less or furthermore 0°.

The fibrous base material may be, for example, a glass cloth.

There will be detailed a laminated body of this embodiment.

Figure 1:
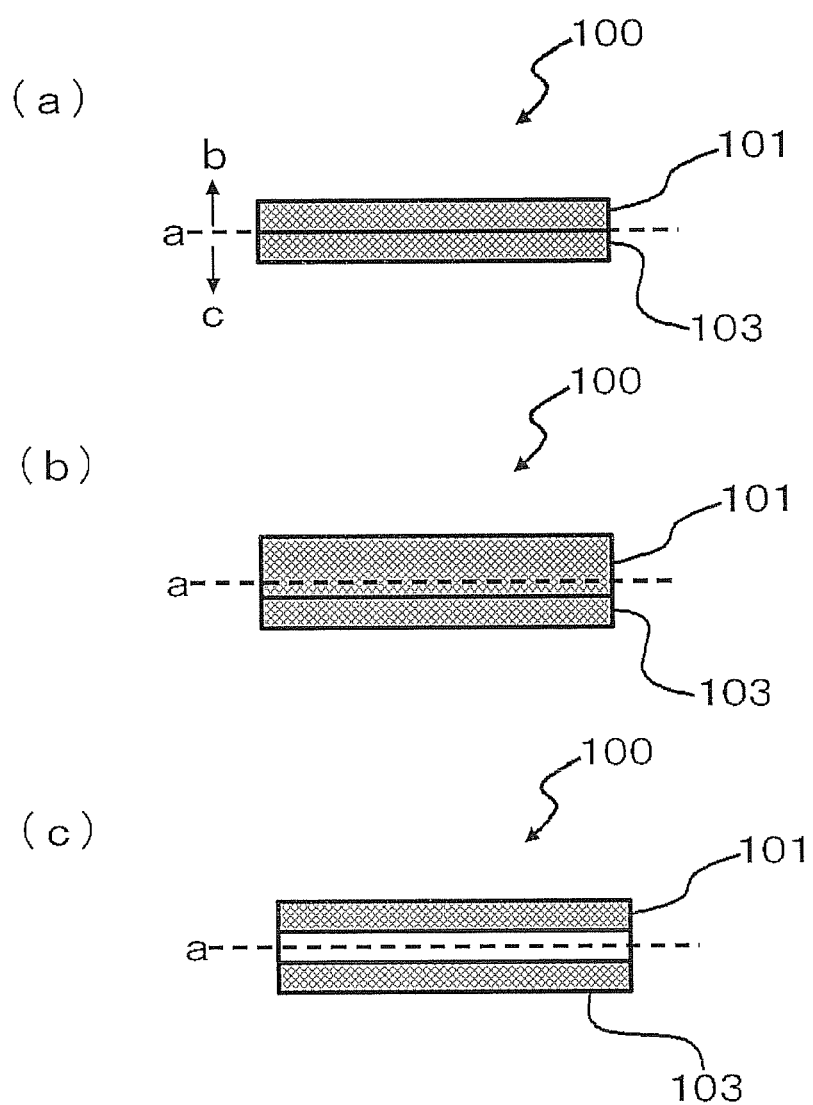
FIG. 1 is a cross-sectional view illustrating an example of a laminated body according to the present invention.

The first resin layer and the second resin layer are disposed such that at least a part of the first resin layer and at least a part of the second resin layer are positioned in separate regions separated by the center line in a thickness direction of the laminated body. For achieving prevention of warpage in a laminated body, the first resin layer and the second resin layer are substantially symmetrically disposed. Therefore, as shown in FIG. 1, it is desirable that when dividing a laminated body 100 into two regions b and c by the center line a in a thickness direction of the laminated body 100, at least a part of the first resin layer 101 is in the region b and at least a part of the second resin layer 103 is in the region c. The first resin layer 101 and the second resin layer 103 are preferably disposed in separate regions separated by the center line a (FIG. 1(a)). Here, at least a part of the first resin layer 101 and at least a part of the second resin layer 103 may be in separate regions, and thus as shown in FIG. 1(b), one resin layer extending across the center line a may be in both regions.

Preferably, the first resin layer 101 and the second resin layer 103 are substantially symmetrically disposed about the center line a in a thickness direction of the laminated body (for example, FIGS. 1(a) and (c)). By substantially symmetrically disposing the first resin layer 101 and the second resin layer 103, warpage in the laminated body can be more effectively prevented. Furthermore, as shown in FIG. 1(c), there may be another layer not having fibrous base material between the first resin layer 101 and the second resin layer 103. Furthermore, the first resin layer 101 and the second resin layer 103 are preferably disposed in the outermost layer of the laminated body (for example, FIGS. 1(a) and (c)).

In this embodiment, at least one of the first fibrous base material and the second fibrous base material locally or overall a bowing region (singular point). A bowing region means a region having a warp and a weft, where the warp and the weft are not at right angles to each other, specifically, a region where a smaller warp/weft crossing angle is less than 90°. A difference of the warp/weft crossing angle from 90° is referred to as a bowing angle, which is expressed by an absolute value.

The bowing region is preferably a region where a smaller warp/weft crossing angle is less than 89°.

The reason is as follows.

If a bowing angle is more than 1°, the first fibrous base material and the second fibrous base material must be particularly deliberately disposed to control a misalignment degree to 2° or less, leading to more marked difference from a conventional laminated body.

Figure 2:
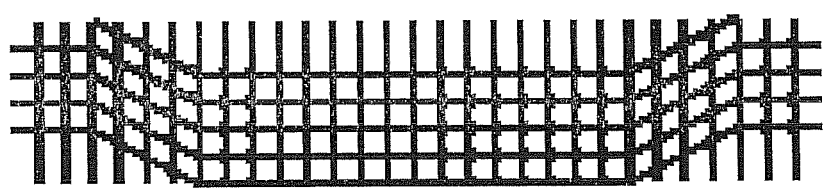
FIG. 2 is a plan view illustrating an example of a bowing type.
Figure 2:
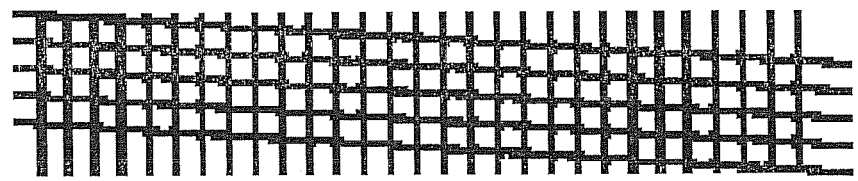

FIGS. 2 (a) and (b) show examples of a bowing type. FIG. 2 (a) shows an example where a fibrous base material formed by weaving warps and wefts at a crossing angle of 90° has bowing region in both ends, and FIG. 2 (b) shows an example where bowing occurs over the whole fibrous base material. In the bowing region, multiple warps and multiple wefts cross each other. A bowing region may be formed locally or overall in the fibrous base material. Either or both of the first fibrous base material and the second fibrous base material may have a bowing region. A rate and a shape of this bowing region in a fibrous base material vary, depending on a manufacturing apparatus for the fibrous base material, and for fibrous base materials prepared using the same lot, the region tends to be formed at the substantially same position in a similar shape.

A bowing region may be formed in any part during the process for manufacturing a fibrous base material, and a currently available manufacturing process cannot prevent formation of a bowing region. Once a bowing is formed, bowings are sequentially formed, resulting in formation of a bowing region.

Figure 3:
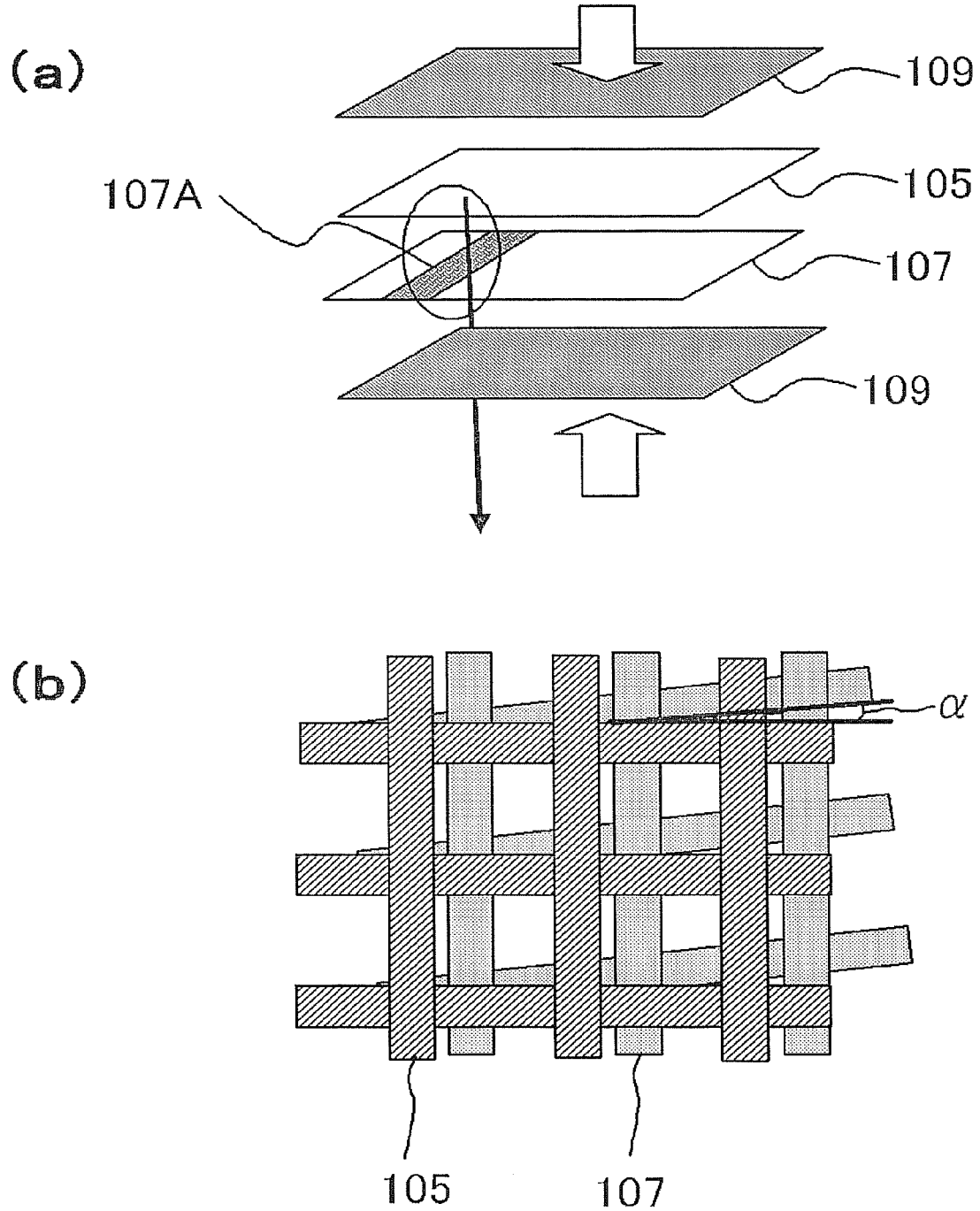
FIG. 3 shows definition of a misalignment degree.

In a laminated body of this embodiment, an angle formed by warps of the first fibrous base material and the second fibrous base material and an angle formed by wefts of the first fibrous base material and the second fibrous base material, whichever is larger, is 2° or less in a bowing region. FIGS. 3 (a) and (b) show definition of a misalignment degree used in the present invention. A laminated body with a copper foil can be, for example, by laminating a first fibrous base material 105 impregnated with a resin composition (that is, a first resin layer) and a second fibrous base material 107 impregnated with a resin composition (that is, a second resin layer) and then sandwiching the laminate between two copper foils 109 (FIG. 3(a)). Here, the second fibrous base material 107 has a bowing region 107A. FIG. 3(b) is an enlarged view of the overlapping part of the first fibrous base material 105 and the second fibrous base material 107. As shown in FIG. 3(b), in a plan view of the laminated body, the wefts of the first fibrous base material 105 and the wefts of the second fibrous base material 107 are not disposed in completely parallel within the bowing region 107A, resulting in misalignment. An angle of the misalignment formed by these wefts (a smaller angle of the angles formed by wefts) a is defined as a misalignment degree. A misalignment degree may be an angle of misalignment between warps. A misalignment degree for wefts and a misalignment degree for warps in the bowing region 107A, whichever is larger, is 2° or less. Alternatively, a misalignment degree for wefts and a misalignment degree for warps may be equal. In such a case, a larger angle may be either of these angles. That is, when one of these angles is 2° or less, the other is also 2° or less.

A misalignment degree may be 2° or less, particularly preferably 1.5° or less and 0° or more.

In a plan view of the laminated body, in the regions other than the bowing region, warps of the first fibrous base material and warps of the second fibrous base material are aligned in their extension direction and mutually parallel (they may completely overlap).

Likewise, in a plan view of the laminated body, in the regions other than the bowing region, wefts of the first fibrous base material and wefts of the second fibrous base material are aligned in their extension direction and mutually parallel (they may completely overlap).

Here, for controlling a misalignment degree formed by the weft (warp) of the first fibrous base material and the weft (warp) of the second fibrous base material to 2° or less within a bowing region and for disposing wefts (warps) of the first fibrous base material and wefts (warps) of the second fibrous base material in the other regions in parallel, overlapping of the first fibrous base material and the second fibrous base material may be devised.

For example, when both first and second fibrous base materials have a bowing region, they may be disposed such that the bowing regions overlap or do not overlap, to control a misalignment degree formed by the weft (warp) of the first fibrous base material and the weft (warp) of the second fibrous base material to 2° or less within a bowing region and to dispose wefts (warps) of the first fibrous base material and wefts (warps) of the second fibrous base material in the other regions in parallel.

When the first or the second fibrous base material has a plurality of bowing regions, a misalignment degree may be controlled to 2° or less in any one of the bowing regions, but in all of the bowing regions, a misalignment degree may be controlled to 2° or less, to more reliably prevent warpage in the laminated body.

The laminated body of this embodiment is characterized in that a misalignment degree is reduced. A fibrous base material may have a bowing region, depending on a manufacturing apparatus. It is based on a fact that in the presence of a bowing region in the fibrous base material, a misalignment degree formed when laminating two or more fibrous base materials finally influences warpage in a core material. In a conventional thicker core material (for example, about 0.8 mm), a misalignment degree little influences warpage and is thus negligible. Therefore, the presence of such a bowing region or a misalignment degree has not been taken into account. However, as a substrate has been thinner, the problem of warpage in a core material has become more significant; in particular, the presence of a bowing region or misalignment cannot be neglected in a thin laminated body. Thus, the present invention is based on the finding that controlling of a misalignment degree in a laminated body is essential for preventing warpage or distortion in a laminated body. By controlling a misalignment degree, a warpage can be significantly reduced even in a thin laminated body.

The smaller a misalignment degree of the fibrous base material is, the more difficult generation of warpage and distortion in a laminated body becomes. According to this embodiment, a misalignment degree between fibrous base materials in the laminated body is 2° or less. Therefore, there is little misalignment between fibrous base materials, so that warpage in a laminated body can be substantially inhibited. A laminated body of this embodiment is suitable for the use in a semiconductor package substrate as a core material with reduced warpage.

A laminated body of this embodiment contains at least the first resin layer and the second resin layer, and there are no particular restrictions to the number of resin layers, and it may further contain additional resin layers. A fibrous base material contained in such an additional resin layer may or may not have a bowing region. Furthermore, a laminated body may contain an additional layer other than a resin layer consisting of a fibrous base material and a resin.

When a laminated body has three or more of resin layers containing a fibrous base material and a resin, particularly when all of these fibrous base materials have a bowing region, it is preferable to control a misalignment degree between all of these fibrous base materials. Preferably, all of misalignment degrees between the fibrous base materials having a bowing region are 2° or less. For example, when a laminated body has the first resin layer, the second resin layer and a third resin layer containing a third fibrous base material and a resin, all of a misalignment degree between the first fibrous base material and the second fibrous base material, a misalignment degree between the first fibrous base material and the third fibrous base material, and a misalignment degree between the third fibrous base material and the second fibrous base material are preferably 2° or less.

In other words, all of the plurality of (here, three or more) fibrous base materials in a laminated body have a bowing region, and in a plan view of the laminated body from the surface of the first resin layer, at least one combination of warps or wefts between each pair of fibrous base materials (all the combinations of fibrous base materials in the plurality of fibrous base materials) cross and an angle formed by the crossing yarns (a smaller angle of angles formed by the yarns) is 2° or less, within a bowing region.

By controlling a misalignment degree between all the fibrous base materials, warpage of a laminated body can be further reduced.

A thickness of a laminated body is preferably 0.025 mm or more and 0.2 mm or less. It is more preferably 0.045 mm or more and 0.15 mm or less. When a thickness of a laminated body is within the above range, the present invention can be particularly effective in preventing warpage, and adequate mechanical strength can be achieved when manufacturing, for example, a circuit board having the laminated body and productivity of, for example, a circuit board can be improved.

A linear expansion coefficient of a laminated body in a planar direction is 2 ppm/° C. or more and 20 ppm/° C. or less, preferably 3 ppm/° C. or more and 15 ppm/° C. or less. A linear expansion coefficient within the above range can result in prevention of warpage, improvement in reliability of a temperature cycle in a circuit board with a copper wiring pattern and a semiconductor package having a semiconductor device, and improvement in reliability of a temperature cycle with a mother board after secondary mounting of the semiconductor package.

A linear expansion coefficient of a laminated body can be determined as described below.

A laminated body is cut into a 4 mm×20 mm sample, and while raising a temperature of the sample from an ambient temperature (25° C.) at a rate of 10° C./min using TMA (TA Instruments Japan), an amount of in-plane displacement (press mode) is determined and a in-plane linear expansion coefficient is calculated. Then, an average in-plane linear expansion coefficient from 25° C. to 300° C. is calculated.

For an elastic modulus of a laminated body of the present invention, preferably the following condition is met:

$$0.05 \leq (A-B)/A \leq 0.5$$

wherein A [GPa] is an elastic modulus at 30° C. and B [GPa] is an elastic modulus at 180° C.

When an elastic modulus is within the above range, during manufacturing, for example, a circuit board having the laminated body, dimensional variation of the laminated body due to variation in an elastic modulus at an elevated temperature around a molding temperature is particularly reduced, resulting in effective reduction of warpage.

In a laminated body of the present invention, a preferable elastic modulus is 15 GPa or more and 40 GPa or less. It is more preferably 18 GPa or more and 35 GPa or less.

An elastic modulus is determined as follows; a 5 mm×30 mm sample is prepared and while raising a temperature at a rate of 5° C./min using a dynamic viscoelastic measuring apparatus (DMA) (Seiko Instruments Inc., DMS 6100), the sample is distorted at a frequency of 10 Hz and an elastic modulus is measured.

Examples of a fibrous base material used in a laminated body include, but not limited to, a synthetic fibrous base material containing, as a main component, a glass fibrous base material such as a glass cloth, a polyamide resin fibers such as a polybenzoxazole resin fiber, a polyamide resin fiber, an aromatic polyamide resin fiber and a wholly aromatic polyamide resin fiber, a polyester resin fibers such as a polyester resin fiber, an aromatic polyester resin fiber and a wholly aromatic polyester resin fiber, a polyimide resin fiber or a fluororesin fiber, or the like, and an organic fibrous base material such as a paper base material containing, as a main component, a craft paper, a cotton linter paper or a mixed paper of a linter and a craft pulp or the like. Among these, a glass cloth is preferable in the light of strength and a water absorption coefficient. The use of a glass cloth can reduce a thermal expansion coefficient of a resin layer.

A material for each fibrous base material contained in a laminated body may be the same or different. Preferably, the same material is used for the first fibrous base material and the second fibrous base material.

A thickness of a fibrous base material contained in a laminated body is, but not limited to, for example, 0.01 mm or more and 0.15 mm or less, preferably 0.015 mm or more and 0.1 mm or less. Individual fibrous base materials contained in a laminated body may have an identical or different thickness. When a thickness of a fibrous base material is within the above range, handling properties during the process to produce the prepreg is improved; in particular, a misalignment degree is controlled to significantly reduce warpage.

A thickness of a resin layer contained in a laminated body may be appropriately selected, depending on, for example, a thickness of a fibrous base material used in the resin layer; for example, 0.015 mm or more and 0.19 mm or less, more preferably 0.02 mm or more and 0.15 mm or less. Individual resin layers contained in a laminated body may have an identical or different thickness. When a thickness of a resin layer is within the above range, a circuit pattern and the properties for filling concaves of the coarse surface of a copper foil can be improved.

A glass transition temperature of a resin contained in a laminated body is preferably 160° C. or more and 270° C. or less, more preferably 180° C. or more and 240° C. or less. When a glass transition temperature is within the above range, heat resistance in lead-free solder reflow can be improved.

A resin layer contained in a laminated body is formed by impregnating a fibrous base material with one or two or more resin compositions. A resin layer may be, for example, a sheet material prepared by impregnating a fibrous base material with a resin composition, which is then semi-cured (so-called prepreg). A sheet material having such a structure is preferable because it exhibits various excellent properties such as dielectric properties and reliability in mechanical and electric connection under high temperature and high humidity conditions, and suitable for manufacturing a printed-wiring board.

A resin composition used for impregnation of a fibrous base material may be selected from those meeting the above conditions for a glass transition temperature and a linear expansion coefficient and having proper strength with no particular restrictions.

Specific examples of a thermosetting resin include novolac type phenol resins such as phenol novolac resins, cresol novolac resins and bisphenol-A novolac resins; phenol resins including resol type phenol resins such as unmodified resol phenol resins, oil-modified resol phenol resins modified with, for example, wood oil, flaxseed oil or walnut oil; bisphenol type epoxy resins such as bisphenol-A type epoxy resins, bisphenol-F type epoxy resins, bisphenol-S type epoxy resins, bisphenol-E type epoxy resins, bisphenol-M type epoxy resins, bisphenol-P type epoxy resins and bisphenol-Z type epoxy resins; novolac type epoxy resins such as phenol novolac type epoxy resins and cresol novolac type epoxy resins; epoxy resins such as biphenyl type epoxy resins, biphenylaralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins and fluorene type epoxy resins; triazine-containing resins such as urea resins and melamine resins; unsaturated polyester resins; bismaleimide resins; polyurethane resins; diallyl phthalate resins; silicone resins; benzoxazine-containing resins; cyanate resins; polyimide resins; polyamide-imide resins; and benzocyclobutene resins.

These may be used alone, two or more of these having different weight-average molecular weights may be combined, or one or more of these may be combined with a prepolymer for these.

Among these, a cyanate resin (including a prepolymer for a cyanate resin) is particularly preferable. The use of a cyanate resin may reduce a thermal expansion coefficient of a resin layer. Furthermore, a cyanate resin exhibits excellent electric properties (a low dielectric constant, a low dielectric tangent), mechanic strength and so on.

The cyanate resin may be, for example, selected from those prepared by reacting a halogenated cyanogen compound with a phenolic compound and prepolymers from these by an appropriate method such as heating as necessary. Specific examples include bisphenol type cyanate resins such as novolac type cyanate resins, bisphenol-A type cyanate resins, bisphenol-E type cyanate resins, tetramethylbisphenol-F type cyanate resins. Among these, novolac type cyanate resins are preferable. The use of a novolac type cyanate resin may increase a crosslink density, resulting in improvement in heat resistance. Thus, flame resistance of, for example, a resin composition can be improved. One of the reasons may be formation of a triazine ring after curing a novolac type cyanate resin. Another possible reason is that a novolac type cyanate resin tends to carbonize due to a higher benzene-ring proportion in its structure. Furthermore, even when a thickness of a resin layer containing a prepreg is 0.5 mm or less, a laminated body containing a resin layer prepared by curing a novolac type cyanate resin exhibits excellent rigidity. In particular, such a laminated body exhibits excellent rigidity during heating and is thus highly reliable during mounting a semiconductor device.

The above novolac type cyanate resin may be a compound represented by general formula (I).

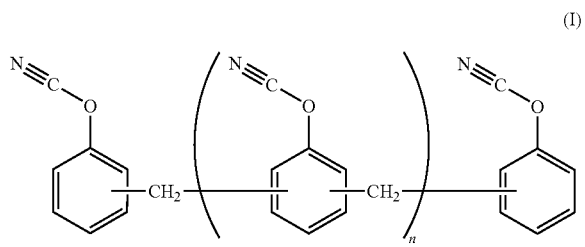

An average repeating-unit number n of the novolac type cyanate resin represented by general formula (I) is an arbitrary integer, which is, but not limited to, preferably 1 to 10, particularly preferably 2 to 7. If the average repeating-unit number n is too small, the novolac type cyanate resin may exhibit poor heat resistance, leading to elimination or evaporation of low molecular-weight materials during heating. If the average repeating-unit number n is too large, a melt viscosity may be so increased that molding properties of a resin layer may be deteriorated.

A weight-average molecular weight (Mw) of the cyanate resin is, but not limited to, preferably Mw 500 to 4,500, particularly 600 to 3,000. If the Mw is too low, a resin layer has tack property, and in the case of contacting, resin layers may adhere to each other or resin transfer may be caused. If the Mw is too high, a reaction speed is so high that molding for forming a substrate (particularly, a circuit board) may be defective or resistance to interlayer peeling may be deteriorated.

An Mw of, for example, the above cyanate resin may be determined by GPC (gel permeation chromatography, converted to a reference material: polystyrene).

Although there are no particular restrictions, the cyanate resins may be used alone, two or more of these having different Mws may be combined, or one or more of these may be combined with a prepolymer for these.

A content of a thermosetting resin in a resin composition is, but not limited to, preferably 5 to 50% by weight on the basis of the total amount of the resin composition, particularly preferably 20 to 40% by weight. If a content of a thermosetting resin is too small, formation of a resin layer may be difficult and if it is too large, strength of the resin layer may be deteriorated.

The resin composition preferably contains an inorganic filler. Thus, even a thin laminated body (for example, a thickness of 0.5 mm or less) can have excellent strength. Furthermore, resistance to thermal expansion of a laminated body can be improved.

Examples of the inorganic filler may include silicates such as talc, calcined clay, uncalcined clay, mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. As an inorganic filler, these may be used alone or in combination of two or more. Among these, silica is preferable and fused silica (especially, spherical fused silica) is particularly preferable in the light of excellent resistance to thermal expansion. A shape of fused silica may be crushed or spherical. For ensuring its ability to impregnate a fibrous base material, it can be used in a way suitable for an expected purpose; for example, using spherical silica for reducing a fused viscosity of a resin composition.

An average particle size of the inorganic filler is, but not limited to, preferably 0.01 to 5.0 μm, particularly preferably 0.1 to 2.0 μm. If a particle size of the inorganic filler is too small, a varnish becomes so viscous that workability during forming a resin layer may be deteriorated. If a particle size of the inorganic filler is too large, disadvantageous phenomena such as precipitation of the inorganic filler may occur in a varnish.

This average particle size can be determined by, for example, a particle size distribution analyzer (HORIBA, Ltd., LA-500).

The inorganic filler may be selected from, but not limited to, inorganic fillers in which an average particle size is monodisperse and inorganic fillers in which an average particle size is polydisperse. Alternatively, inorganic fillers in which an average particle size is monodisperse and/or polydisperse may be used alone or in combination of two or more.

Furthermore, an inorganic filler is preferably spherical silica having an average particle size of 5.0 μm or less (especially, spherical fused silica), particularly preferably spherical fused silica having an average particle size of 0.01 to 2.0 μm. Thus, filling properties of an inorganic filler may be improved.

A content of an inorganic filler is, but not limited to, preferably 20 to 80% by weight on the basis of the total amount of a resin composition, particularly preferably 30 to 70% by weight. When the content is within the above range, the layer may be resistant to thermal expansion and less hygroscopic.

When the thermosetting resin is a cyanate resin (particularly, a novolac type cyanate resin), it is preferable that an epoxy resin (substantially free from halogen) is further contained. Examples of the epoxy resin include bisphenol type epoxy resins such as bisphenol-A type epoxy resins, bisphenol-F type epoxy resins, bisphenol-E type epoxy resins, bisphenol-S type epoxy resins, bisphenol-M type epoxy resins, bisphenol-P type epoxy resins and bisphenol-Z type epoxy resins; novolac type epoxy resins such as phenol novolac type epoxy resins and cresol novolac type epoxy resins; arylalkylene type epoxy resins such as biphenyl type epoxy resins, xylylene type epoxy resins and biphenylaralkyl type epoxy resins; naphthalene type epoxy resins; anthracene type epoxy resins; phenoxy type epoxy resins, dicyclopentadiene type epoxy resins, norbornene type epoxy resins, adamantane type epoxy resins and fluorene type epoxy resins.

As an epoxy resin, these may be used alone, two or more of these having different weight-average molecular weights may be combined, or one or more of these may be combined with a prepolymer for these.

Among these epoxy resins, an arylalkylene type epoxy resin is particularly preferable. Thus, solder heat resistance after moisture absorption treatment and flame resistance can be improved.

The above arylalkylene type epoxy resin is an epoxy resin having one or more arylalkylenes in a repeating unit; for example, xylylene type epoxy resins and biphenyldimethylene type epoxy resins. Among these, a biphenyldimethylene type epoxy resin is preferable. A biphenyldimethylene type epoxy resin can be represented by, for example, general formula (II).

product cannot be prepared. An Mw of the epoxy resin may be determined by, for example, GPC.

When a cyanate resin (especially, a novolac type cyanate resin) is used as the thermosetting resin, it is preferable that a phenol resin may be further contained. The phenol resin may be selected from, for example, novolac type phenol resins, resol type phenol resins and arylalkylene type phenol resins. As the phenol resin, these may be used alone, two or more of these having different weight-average molecular weights may be combined, or one or more of these may be combined with a prepolymer for these. Among these, an arylalkylene type phenol resin is particularly preferable. Thus, solder heat

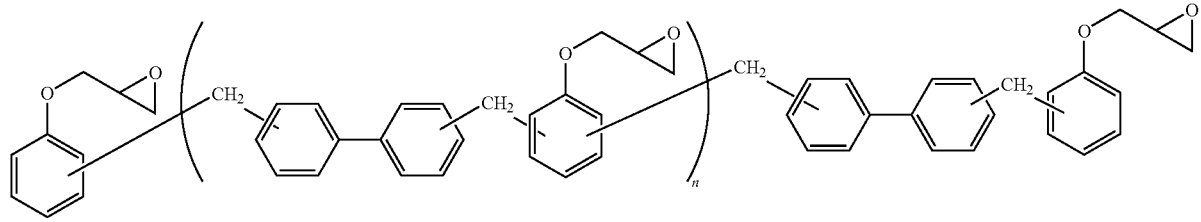

(II)

An average repeating-unit number n of the biphenyldimethylene type epoxy resin represented by general formula (II) is an arbitrary integer, which is, but not limited to, preferably 1 to 10, particularly preferably 2 to 5. If the average repeating-unit number n is too small, the biphenyldimethylene type epoxy resin tends to be crystallized and may be thus less soluble in a common solvent, so that it cannot be easily handled. If the average repeating-unit number n is too large, flowability of a resin may be deteriorated, causing defective molding.

A content of the above epoxy resin is, but not limited to, preferably 1 to 55% by weight on the basis of the total amount resistance after moisture absorption treatment can be improved.

Examples of the arylalkylene type phenol resin may include xylylene type phenol resins and biphenyldimethylene type phenol resins. The biphenyldimethylene type phenol resin may be represented by, for example, general formula (III).

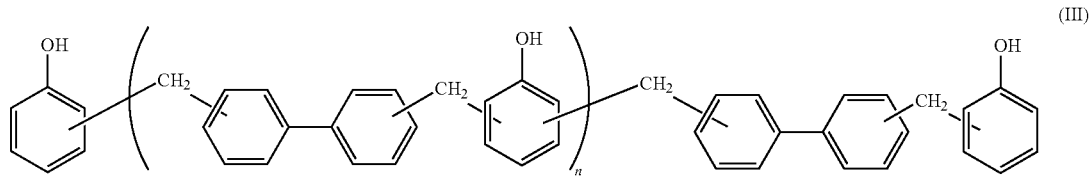

(III)

of the resin composition, particularly preferably 2 to 40% by weight. If a content of the epoxy resin is too small, the cyanate resin may be less reactive or a product formed may exhibit deteriorated resistance to humidity. If the content is too large, heat resistance may be deteriorated.

A weight-average molecular weight (Mw) of the epoxy resin is, but not limited to, preferably Mw 500 to 20,000, particularly preferably 800 to 15,000. If the Mw is too low, a resin layer may have tack property, and if the Mw is too high, its ability to impregnate a fibrous base material during forming a resin layer may be so deteriorated that a homogeneous An average repeating-unit number n of the biphenyldimethylene type phenol resin represented by general formula (III) is an arbitrary integer, which is, but not limited to, preferably 1 to 12, particularly preferably 2 to 8. If the average repeating-unit number n is too small, heat resistance may be deteriorated. If the average repeating-unit number n is too large, compatibility with other resins may be deteriorated, leading to deterioration in workability.

The use of a combination of the above cyanate resin (especially, a novolac type cyanate resin) with an arylalkylene type phenol resin allows a crosslink density to be controlled and reactivity to be easily controlled.

A content of the phenol resin is, but not limited to, preferably 1 to 55% by weight on the basis of the total amount of the resin composition, particularly preferably 5 to 40% by weight. If a content of the phenol resin is too small, heat resistance may be deteriorated and if it is too large, resistance to thermal expansion may be deteriorated.

A weight-average molecular weight (Mw) of the phenol resin is, but not limited to, preferably Mw 400 to 18,000, particularly preferably 500 to 15,000. If the Mw is too low, the resin layer may have tack property, and if it is too high, its ability to impregnate a fibrous base material during forming a resin layer may be so deteriorated that a homogeneous product cannot be prepared. An Mw of the phenol resin may be determined by, for example, GPC.

Furthermore, when a combination of the cyanate resin (especially, a novolac type cyanate resin), the phenol resin (an arylalkylene type phenol resin, particularly a biphenyldimethylene type phenol resin) and the epoxy resin (an arylalkylene type epoxy resin, particularly a biphenyldimethylene type epoxy resin) is used for preparing a substrate (especially, a circuit board), particularly excellent dimensional stability can be achieved.

In addition, a resin composition may appropriately contain, if necessary, additives such as a curing agent, a hardening accelerator, a thermoplastic resin, an organic filler and a coupling agent. A resin composition used in the present invention may be suitably in a liquid state where the above components are dissolved and/or dispersed in, for example, an organic solvent.

The use of a coupling agent can improve wettability of an interface between the thermosetting resin and the inorganic filler, so that the resin composition can be homogeneously settled on the fibrous base material. Thus, the use of a coupling agent is preferable in the light of improvement in heat resistance, particularly resistance to solder heating after water absorption.

The coupling agent may be selected from those commonly used as a coupling agent; specifically, one or more coupling agents may be preferably used, which are selected from epoxysilane coupling agents, cationic silane coupling agents, aminosilane coupling agents, titanate coupling agents and silicone oil type coupling agents.

There are no particular restrictions to an amount of the coupling agent because it depends on a specific surface area of the inorganic filler, and it is preferably 0.05 to 3 parts by weight to 100 parts by weight of the inorganic filler, particularly preferably 0.1 to 2 parts by weight. If a content of the coupling agent is too small, the inorganic filler cannot be sufficiently covered, so that its effect of improving heat resistance may be deteriorated, and if the content is too large, it may influence the reaction, leading to deterioration in, for example, bending strength.

The above hardening accelerator may be selected those known in the art. Examples may include organometallic salts such as zinc naphthenate, cobalt naphthenate, tin octylate, cobalt octylate, cobalt (II) bisacetylacetonate and cobalt (III) trisacetylacetonate; tertiary amines such as triethylamine, tributylamine and diazabicyclo[2,2,2]octane; imidazoles such as 2-phenyl-4-methylimidazole, 2-ethyl-4-ethylimidazole, 2-phenyl-4-methylimidazole, 2-phenyl-4-methyl-5-hydroxyimidazole, 2-phenyl-4,5-dihydroxyimidazole; phenol compounds such as phenol, bisphenol-A and nonylphenol; organic acids such as acetic acid, benzoic acid, salicylic acid and para-toluenesulfonic acid; and their mixtures. As a hardening accelerator, these including their derivatives may be used alone or in combination of two or more including their derivatives.

A content of the hardening accelerator is, but not limited to, preferably 0.05 to 5% by weight on the basis of the total amount of the resin composition, particularly preferably 0.2 to 2% by weight. If the content is too small, hardening may not be accelerated and if it is too large, storage stability of the resin layer may be deteriorated.

The resin composition may contain a combination of thermoplastic resins such as phenoxy resins, polyimide resins, polyamide-imide resins, polyphenylene oxide resins, polyether sulfone resins, polyester resins, polyethylene resins and polystyrene resins; polystyrene thermoplastic elastomers such as styrene-butadiene copolymers and styrene-isoprene copolymers; thermoplastic elastomers such as polyolefin thermoplastic elastomers, polyamide elastomers and polyester elastomers; and diene elastomers such as polybutadienes, epoxy-modified polybutadienes, acryl-modified polybutadienes and methacryl-modified polybutadienes.

The above resin composition may contain, if necessary, additives other than those described above such as pigments, dyes, deforming agents, leveling agents, ultraviolet absorbers, foaming agents, antioxidants, flame retarders and ion scavengers.

A fibrous base material may be impregnated with a resin composition by, but not limited to, dissolving a resin composition in a solvent to prepare a resin varnish and immersing fibrous base material in the resin varnish, application using any of various coaters, spraying using a spaying device, laminating a resin layer with a supporting base material or the like. Among these method, preferred is immersing a fibrous base material in a resin varnish. Thus, impregnating ability of the resin composition to the fibrous base material may be improved. When a fibrous base material is immersed in a resin varnish, a common impregnating application apparatus can be used.

When a thickness of a fibrous base material is 0.045 mm or less, it is preferable that both surfaces of the fibrous base material are laminated with film resin layers. Thus, the amount of impregnation of a fibrous base material with a resin composition can be freely adjusted to improve molding properties of a prepreg. When film resin layers are used for lamination, a vacuum laminating apparatus is preferably used.

Specifically, a resin layer (a first resin layer, a second resin layer and so on) containing the fibrous base material of this embodiment may be formed by, for example, the following method.

Figure 4:
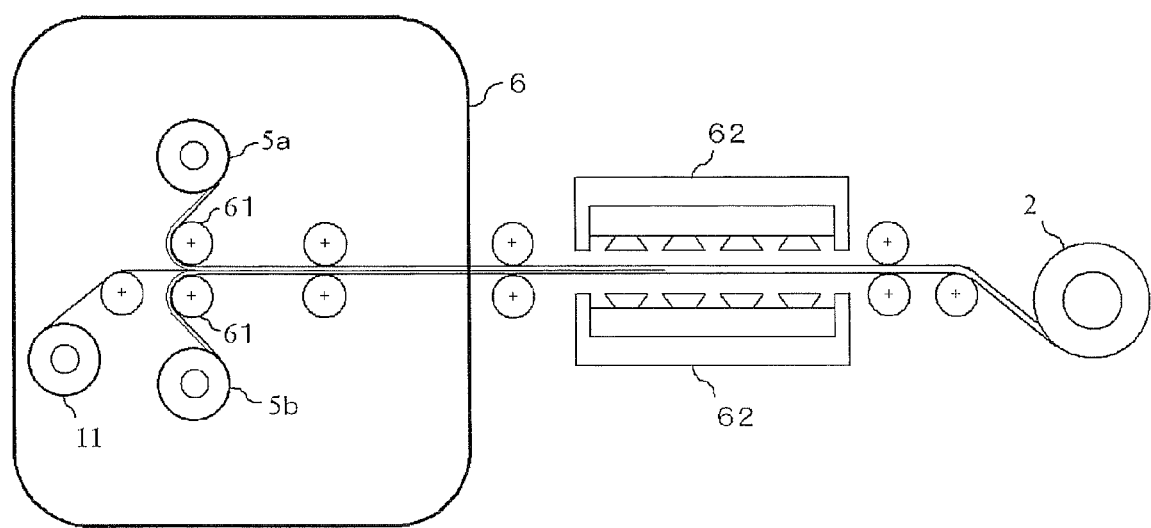
FIG. 4 is a flow chart illustrating an example of a process for manufacturing a resin layer of the present invention.

FIG. 4 is a chart illustrating an example of a process for manufacturing a resin layer 2. There will be specifically described a process where carrier materials 5a, 5b are preliminarily prepared, and these carrier materials 5a, 5b are used for laminating a fibrous base material (a first fibrous base material, a second fibrous base material and so on) 11, and then a carrier film is peeled.

Preliminarily, a carrier material 5a that is produced by applying a first resin composition to a carrier film and a carrier material 5b that is produced by applying a second resin composition to a carrier film are prepared. Then, the carrier materials 5a and 5b are laminated on both surfaces of a fibrous base material under reduced pressure using a vacuum laminator 6 and they are laminated together using a laminate roll 61. When laminating is conducted under reduced pressure, an unfilled part within the fibrous base material 11 or in the junction of the resin layer in the carrier materials 5a, 5b and the fibrous base material 11 can be, if present, converted to a low-pressure void or a substantially vacuum void. Therefore, voids formed in the finally-formed resin layer 2 can be reduced. It is because a low-pressure void or a vacuum void can be eliminated by a heating process as described later.

Another apparatus which can laminate the fibrous base material 11 and the carrier materials 5a, 5b under such reduced pressure may include a vacuum box apparatus.

Next, after the fibrous base material 11 and the carrier materials 5a, 5b are laminated, the product is heated at a temperature equal to or higher than a melting temperature of the resin applied to the carrier material using an air forced oven 62. Thus, the low-pressure voids formed in the laminating process under reduced pressure can be substantially eliminated. The heating may be conducted using another apparatus such as an infrared heater, a heating roller and a flat hot plate press.

After the fibrous base material 11 is laminated with the carrier materials 5a, 5b, the carrier film is peeled. Thus, a resin material is supported by the fibrous base material 11 with a thickness of 0.15 mm or less, to provide a resin layer 2 containing the fibrous base material 11.

When a fibrous base material is immersed in a resin varnish, it is desirable that a solvent used for the resin varnish can easily dissolve the resin components in the resin composition, but a poor solvent may be used as long as it does not adversely affect the process. Examples of a solvent exhibiting good dissolving ability include acetone, methyl ethyl ketone, methyl isobutyl ketone, cyclohexanone, tetrahydrofuran, dimethylformamide, dimethylacetamide, dimethyl sulfoxide, ethylene glycol, cellosolves and carbitols.

A solid content in the resin varnish is, but not limited to, preferably 40 to 80% by weight, particularly preferably 50 to 65% by weight. Thus, impregnating ability of the resin varnish to a fibrous base material can be further improved. The fibrous base material can be impregnated with the resin composition and dried at a predetermined temperature, for example, 80 to 200° C., to provide a resin layer such as a prepreg.

Next, there will be described a process for manufacturing a laminated body of this embodiment.

First, a first resin layer including a first fibrous base material and a resin and a second resin layer including a second fibrous base material and a resin are prepared. Then, the first resin layer and the second resin layer are disposed such that at least a part of the first resin layer and at least apart of the second resin layer are positioned in separate regions separated by the center line in a thickness direction of the laminated body. The arrangement of the first resin layer and the second resin layer are as described above with reference to FIG. 1.

In the step of disposing the first resin layer and the second resin layer, it is preferable that the first resin layer and the second resin layer are substantially symmetrically disposed in the light of prevention of warpage in the laminated body.

Then, the first resin layer 101 and the second resin layer 103 are laminated such that in the bowing region, an angle formed by the warp of the first fibrous base material 105 and the warp of the second fibrous base material 107 and an angle formed by the weft of the first fibrous base material 105 and the weft of the second fibrous base material 107, whichever is larger, is 2° or less. That is, between the first fibrous base material 105 and the second fibrous base material 107, a larger warp/weft misalignment degree within the bowing region is 2° or less in a plan view from a direction of the surface of the resin layer. The first resin layer 101 and the second resin layer 103 may be laminated directly or via another layer.

Furthermore, when the laminated body has a third resin layer containing a third fibrous base material and a resin, the first to the third resin layers are laminated such that an angle formed by warps (a smaller angle formed by warps) and an angle formed by wefts (a smaller angle formed by wefts) is 2° or less between each pair of fibrous base materials within the bowing region in a plan view of the laminated body.

Furthermore, in the step of disposing the first resin layer and the second resin layer, the first resin layer and the second resin layer may be disposed such that they are the outermost layers of the laminated body.

A misalignment degree can be determined, for example, by drawing a line with a predetermined length on a warp or weft in each fibrous base material using a magic marker while observing an appearance of the resin layer visually or via a stereoscopic microscope and measuring a crossing angle of the warp or the weft using a protractor.

The resin-impregnated fibrous base material set as described above can be molded into a laminated body by a known method. For example, the above resin-impregnated fibrous base materials can be laminated and heated under pressure to give a laminated body of the present invention.

Furthermore, the above laminated body may be a laminated body with a metal foil where a metal foil is formed on at least one surface. When a resin layer is disposed over the outermost layer of the laminated body, a laminated body with a metal foil has a structure that a metal foil is further laminated on the resin layer.

A thickness of the metal foil is preferably 1 µm or more and 18 µm or less. More preferably, it is 2 µm or more and 12 µm or less. When a thickness of the metal foil is within the above range, a fine pattern can be formed and a misalignment degree can be controlled to further reduce warpage.

Examples of a metal constituting the above metal foil may include copper and copper alloys, aluminum and aluminum alloys, silver and silver alloys, gold and gold alloys, zinc and zinc alloys, nickel and nickel alloys, tin and tin alloys, and iron and iron alloys. Alternatively, an electrolytic copper foil with a carrier may be used.

Among others, a metal constituting a metal foil is preferably a copper foil.

Instead of a metal foil, a film may be laminated on at least one surface of the laminated body of the present invention. Examples of such a film may include polyethylene, polypropylene, polyethylene terephthalate, polyimides and fluororesins.

The laminated body with a metal foil can be prepared as described below. When a prepreg is laminated as a resin layer, a metal foil is placed on both or one of the outer sides of the laminated first prepreg and the second prepreg, and they are laminated under high vacuum. Then, the laminate having the prepregs, the metal foil and so on can be heated under pressure to provide a laminated body.

The heating can be conducted using an appropriate apparatus such as, but not limited to, an air forced oven, an infrared heater, a heating roller and a flat hot plate press. When an air forced oven or an infrared heated is used, heating can be conducted without the laminated product being substantially pressed. When a heating roller or a flat hot plate press is used, heating can be conducted by applying a predetermined pressure to the above laminated product.

Although there are no particular restrictions to a temperature during the heating, it is preferable to employ a temperature range where a resin used is fused while a curing reaction of the resin does not rapidly proceed. A heating temperature is, for example, preferably 120 to 220° C., more preferably 150 to 200° C. Furthermore, there are no particular restrictions to a heating period because it depends on various factors such as the type of a resin used, but the heating can be conducted for 1 to 300 min.

A pressure is, but not limited to, for example, preferably 0.2 to 5 MPa, more preferably 2 to 4 MPa.

A laminated body can be used in a circuit board. A circuit board having a laminated body can be manufactured, for example, as described below.

A through-hole for interlayer connection is formed in the laminated body with a metal foil formed as described above, and a circuit is formed by a subtractive method. Then, over the product is laminated a given buildup material, and the process of interlayer connection and circuit formation is repeated by an additive method to manufacture a circuit board.

Furthermore, a semiconductor device can be mounted on a circuit board of the present invention to manufacture a semiconductor package. A semiconductor package of the present invention has, for example, a laminated body with a metal foil in which a circuit is formed, a solder resist layer and an IC chip. The solder resist layer is formed on the circuit side of the laminated body. The solder resist layer is exposed, developed and cured, resulting in formation of a land for solder ball binding. The IC chip is mounted on a resin side of the laminated body with a metal foil and a solder resist layer in which a circuit is formed. Here, the IC chip and the circuit are bound by a bump in the via hole. Thus, a semiconductor package can be provided.

As described above, this embodiment provides a laminated body in which warpage is reduced. In particular, even in a thin laminated body, warpage can be effectively prevented. Furthermore, a circuit board using the laminated body of this embodiment exhibits excellent mechanical properties such as warpage resistance and dimensional stability and moldability. The laminated body of this embodiment can be, therefore, suitably used for applications required to be reliable such as a printed-wiring board to be high-density and highly multilayered.

In the laminated body of this embodiment, warpage is reduced in the above circuit formation and the subsequent processes. A semiconductor package of the present invention is, therefore, resistant to warpage and crack formation and thus can be thinned.

There have been described some embodiments of the present invention, but these are just illustrative of this invention and various configurations other than those described above may be employed.

EXAMPLES

The present invention will be described with reference to, but not limited to, Examples and Comparative Examples.

Example 1

A laminated body with a copper foil was manufactured as described below.
(1) Preparation of a Resin Varnish
19.7 parts by weight of a novolac type cyanate resin (Lonza Japan Ltd., Primaset PT-30, weight-average molecular weight: about 700), 11 parts by weight of a biphenyldimethylene type epoxy resin (Nippon Kayaku Co., Ltd., NC-3000H, epoxy equivalent: 275), 9 parts by weight of a biphenyldimethylene type phenol resin (Meiwa Plastic Industries, Ltd., MEH-7851-3H, hydroxide equivalent: 230) and 0.3 parts by weight of an epoxy silane type coupling agent (GE Toshiba Silicones Co., Ltd., A-187) were dissolved in methyl ethyl ketone at an ambient temperature, and 60 parts by weight of a spherical fused silica (Admatechs Co. Ltd., spherical fused silica, SO-25R, average particle size: 0.5 μm) was added to the mixture, and the mixture was stirred for 10 min using a high-speed stirrer to give a resin varnish.
(2) Preparation of a Prepreg A glass cloth with a width of 1060 mm (thickness: 94 μm, Nitto Boseki Co., Ltd., WEA-116E) was impregnated with the above resin varnish, and was dried in an oven at 150° C. for 2 min. Thus, a prepreg was prepared, in which a varnish solid content was about 50% by weight. The prepreg had a thickness of 0.1 mm.

Figure 5:
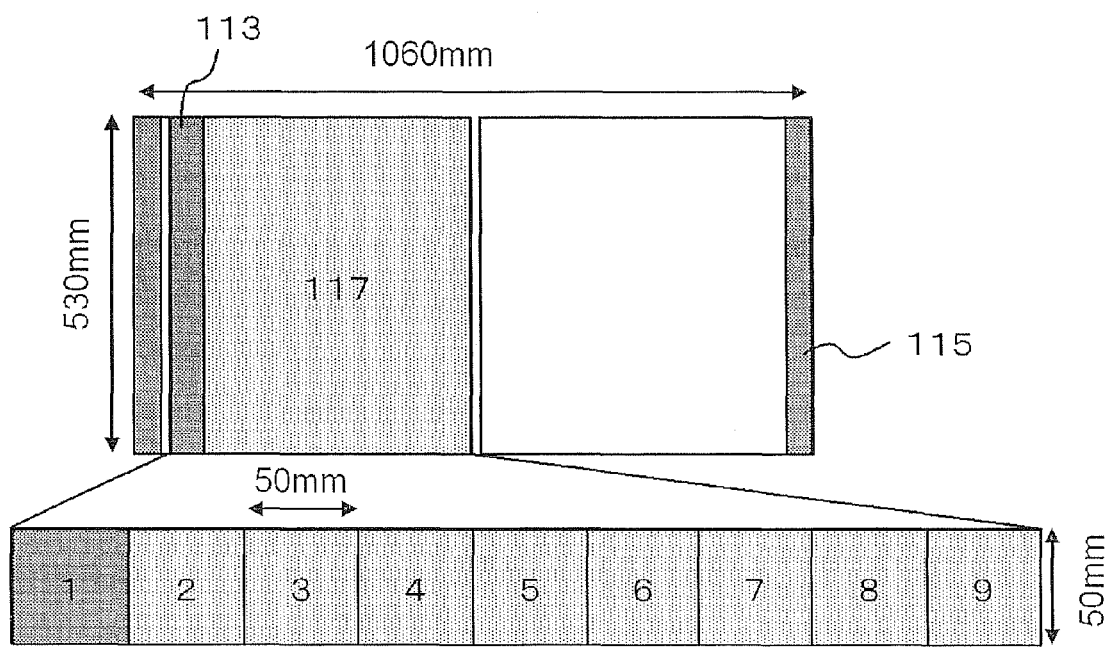
FIG. 5 is a plan view illustrating an example of a prepreg used in Examples and Comparative Examples.

FIG. 5 is a plan view of the prepreg prepared in this example. In FIG. 5, the surface 117 of the prepreg is up. The prepreg with an application width of 1060 mm was divided into two parts, which were used as an evaluation substrate. As shown in FIG. 5, one horizontal row of the 530 mm ×530 mm prepreg was as a sample divided into 50 mm ×50 mm sections, which were called sections 1 to 9. A misalignment angle in each section was measured.

A misalignment angle was measured as described below. While observing the appearance of each 50 mm×50 mm section in the prepreg visually or via a stereoscopic microscope, a 50 mm line was drawn on the warps and the wefts of the glass cloth with a magic marker. A crossing angle between warps and wefts was measured using a protractor. A misalignment angle for each section was calculated by subtracting the measured crossing angle from 90°. The results are shown in Table 1. Section 1 had a singular point with a misalignment angle of 2.1° (bowing region), section 2 had a singular point with a misalignment angle of 1.0° (bowing region), and section 6 had a singular point with a misalignment angle of 0.5° (bowing region). In FIG. 5, section 1 with the maximum misalignment angle is indicated by symbol 113.

TABLE 1

| | Section | | | | | | | | |
|---|---|---|---|---|---|---|---|---|---|
| | 1 | 2 | 3 | 4 | 5 | 6 | 7 | 8 | 9 |
| Misalignment angle (°) | 2.1 | 1.0 | 0 | 0 | 0 | 0.5 | 0 | 0 | 0 |
| Prepreg thickness (μm) | 103 | 103 | 104 | 104 | 104 | 103 | 104 | 104 | 105 |

(3) Process for Manufacturing a Laminated Body with a Copper Foil

The above prepreg was cut into 530 mm×530 mm pieces, and both edges (selvage) of the glass cloth were also removed. The two prepregs thus obtained were superposed and copper foils with a thickness of 12 μm were laminated on both surfaces, and the laminate was heated and pressed at a pressure of 4 MPa and a temperature of 200° C. for 2 hours. Thus, a laminated body with copper foils on both sides with a thickness of 0.23 mm was obtained.

Here, an in-plane linear expansion coefficient in the laminated body except the copper foil was 11 ppm/° C. An in-plane linear expansion coefficient was determined as follows; a 4 mm×20 mm sample was taken from the laminated body except the copper foil and the sample was heated from 25° C. to 300° C. at a rate of 10° C./min using a TMA apparatus (TMA) (TA Instruments Japan) and then an average in-plane linear expansion coefficient was calculated.

In the laminated body except the copper foil, an elastic modulus A at 30° C. was 30 [GPa] and an elastic modulus B at 180° C. was 26 [GPa]. Furthermore, (A−B)/A was 0.13. An elastic modulus was determined as follows; a 5 mm×30 mm sample was taken from the laminated body except the copper foil and while the sample was heated at a rate of 5° C./min using a dynamic viscoelastic measuring apparatus (DMA) (Seiko Instruments Inc., DMS 6100), distortion at a frequency of 10 Hz was applied to the sample and a dynamic viscoelasticity was measured.

(4) Setting Method of a Laminated Body with a Copper Foil

The two 530 mm×530 mm prepregs were laminated in any of the setting pattern shown in FIGS. 6(a) to (d), and were processed as described in the above (3) to prepare a laminated body with a copper foil. Thus, four types of laminated bodies with a copper foil according to setting methods A to D were obtained.

Figure 6:
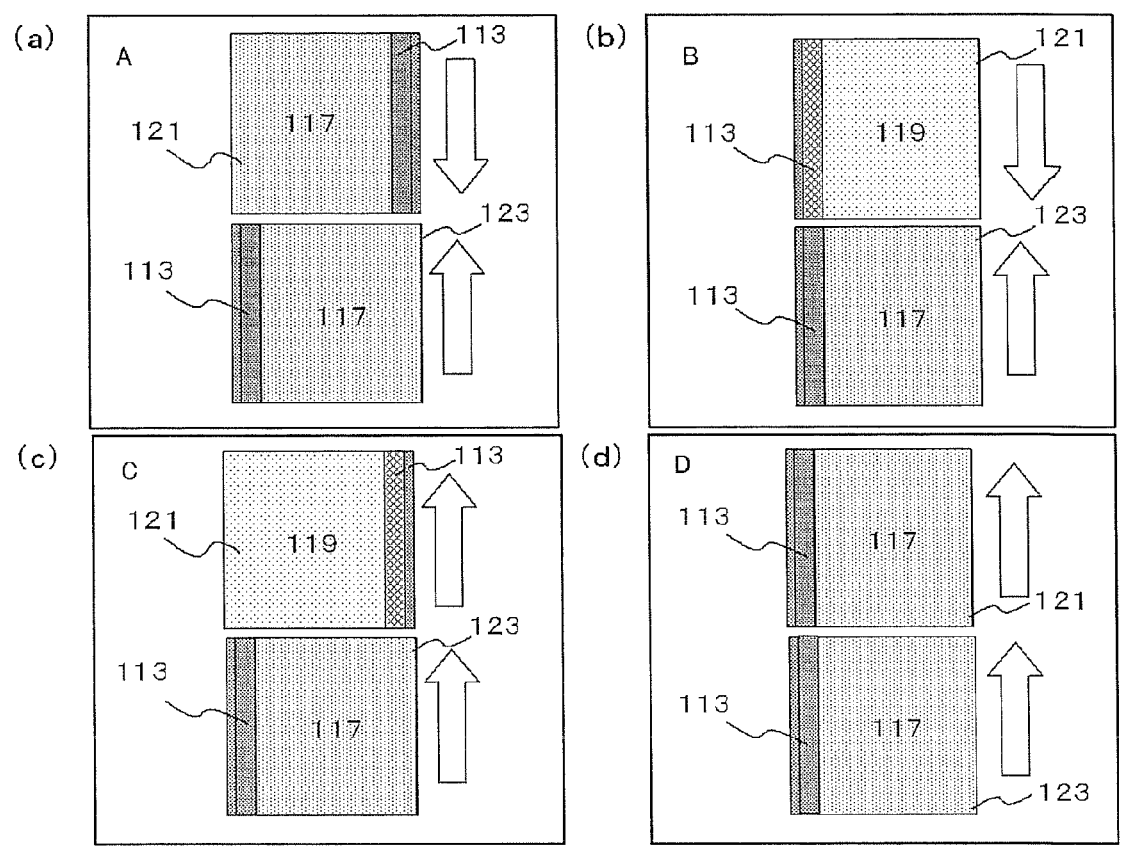
FIG. 6 is a schematic view illustrating a method of setting a prepreg.

The setting methods of the two prepregs will be described. FIGS. 6(a) to (d) show a setting method of laminating two prepregs one above the other. The upper prepreg 121 and the lower prepreg 123 have, when being viewed the surface up, strip-shaped singular point (bowing region) 113 in the left edge from a flow direction. In these figures, an arrow indicates a flow direction and here, the flow direction is a direction of resin composition application. In the current method, as shown in FIG. 6(a), all the prepregs are laminated such that the positions of singular points are not overlapped while the surfaces 117 are up (setting method A). Other setting patterns include a pattern where the prepregs are laminated such that the positions of singular points 113 are overlapped while the rear surface 119 is up in one prepreg and the surface 117 is up in the other prepreg (FIG. 6(b), setting method B); a pattern where the prepregs are laminated such that the positions of singular points 113 are not overlapped while the rear surface 119 is up in one prepreg and the surface 117 is up in the other prepreg (FIG. 6(c), setting method C); and a pattern where the prepregs are laminated such that the positions of singular points 113 are overlapped while the surfaces 117 of the upper and the lower prepregs were up (FIG. 6(d), setting method D). In terms of these four setting patterns, the laminated body has two singular points 113 containing a bowing region in both edges in the setting methods in FIGS. 6(a) and (c), while there is one singular point 113 in the setting methods in FIGS. 6(b) and (d). When the prepregs were laminated in the pattern in FIG. 6(d), a misalignment degree was minimized (misalignment degree: 0°).

Figure 7:
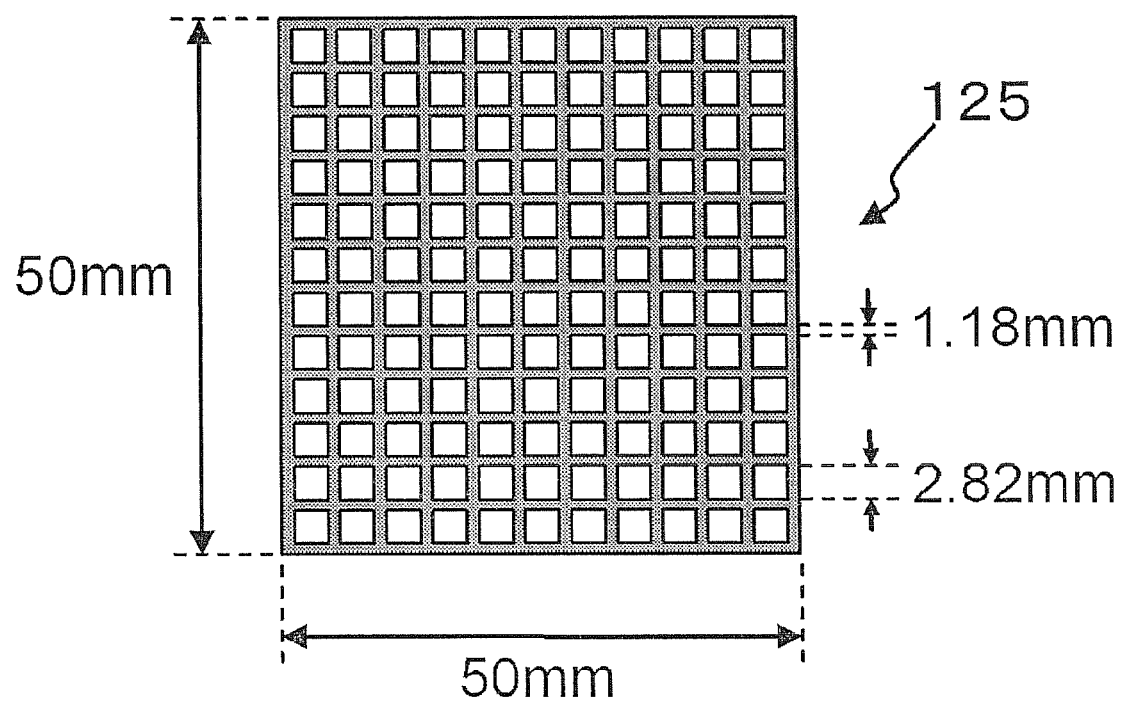
FIG. 7 is a plan view illustrating an example of a mesh pattern of a copper circuit in a laminated body with a copper foil.

In the setting methods A to D, a misalignment degree was 2° or less in both sections 2, 6. Furthermore, in the setting methods A to D, the warps in one prepreg and in the other prepreg were aligned in their extension direction and mutually parallel in the regions other than sections 1, 2 and 6 in a plan view of the laminated body. Likewise, wefts in one prepreg and in the other prepreg were aligned in their extension direction and mutually parallel.

a mesh pattern with a copper circuit width of 1.18 mm and an inter-copper-circuit distance of 2.82 mm was formed in both sides of the laminated body with a copper foil by etching (FIG. 7). The same mesh pattern was formed in both sides, and a residual copper rate was 50%.

(5) Warpage Evaluation of a Laminated Body with a Copper Foil

Figure 8:
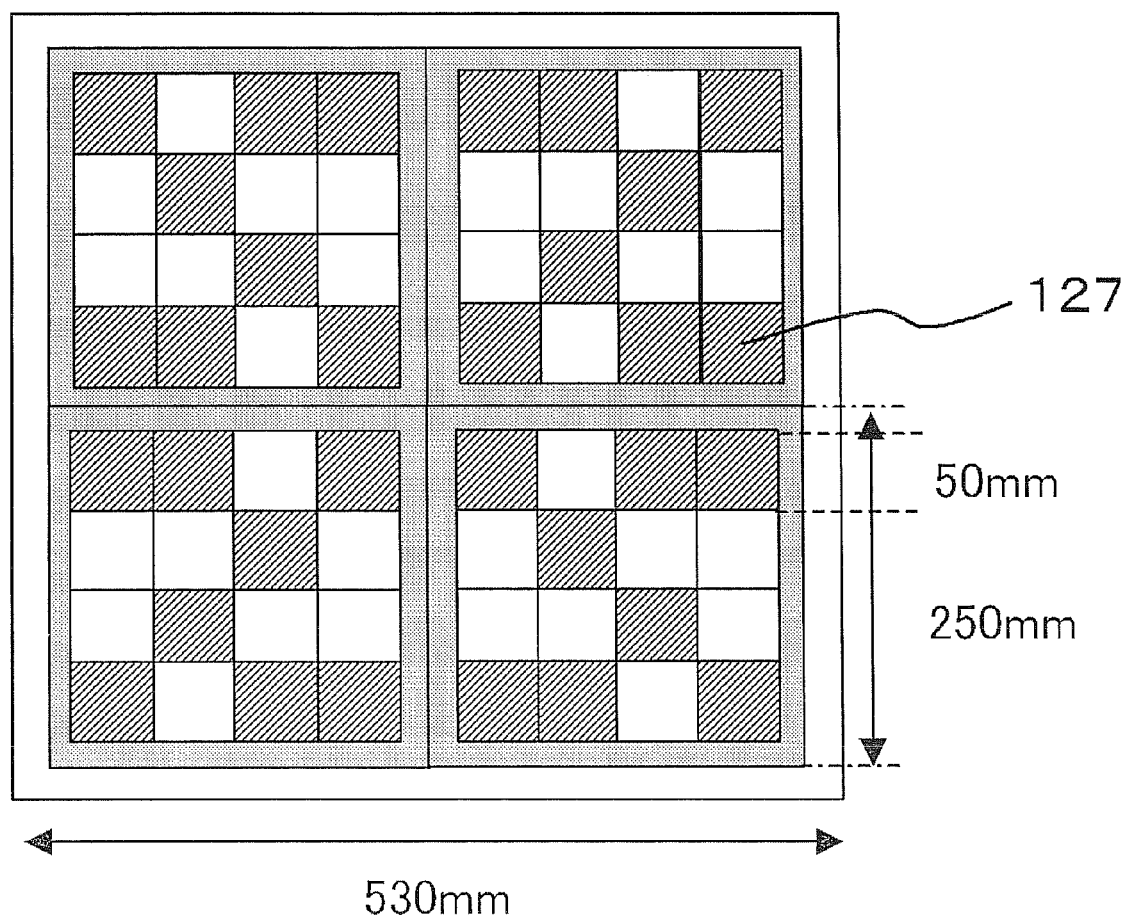
FIG. 8 is a plan view illustrating a sample for warpage evaluation in a laminated body with a copper foil.

Furthermore, as shown in FIG. 8, a mesh-patterned 530 mm×530 mm laminated body with a copper foil was cut into 50 mm×50 mm pieces, and 32 pieces shaded in the figure in total were used as samples 127 for warpage evaluation. Here, in the 530 mm×530 mm laminated body with a copper foil, a warpage amount may vary depending on a position due to variation in the manufacturing conditions. Therefore, sampling was performed for various positions.

A warpage amount was determined under the conditions of a measurement area of 48 mm×48 mm, a measurement pitch of 4 mm (in both X and Y directions) and 25° C. using a variable temperature laser three-dimensional measuring apparatus (LS220-MT100, T-Tech Co. Ltd.). For ensuring detection of laser reflection, measurement was performed at a point on a copper circuit. The warpage data thus obtained was subjected to slope correction by a least-squares method, and a difference between the maximum and the minimum was defined as a warpage amount. The smaller a warpage amount is, the smaller warpage is. For the setting methods A to D, warpage amounts (μm) were measured for the 32 samples for warpage evaluation 127, and their average and variation coefficient were calculated. In addition, the maximum misalignment degree in the 32 samples for warpage evaluation was calculated on the basis of a misalignment angle of the prepreg. The results are shown in Table 2.

TABLE 2

|  | Setting method | | | |
| --- | --- | --- | --- | --- |
|  | A | B | C | D |
| Maximum misalignment degree (°) | 2.1 | 4.2 | 2.1 | 0 |
| Average warpage amount (μm) | 140 | 130 | 155 | 95 |
| Variation coefficient | 0.58 | 0.53 | 0.59 | 0.25 |

Table 2 shows that in the setting method D, an average warpage amount is small and warpage is reduced even when there is a bowing region. In contrast, in the setting methods A to C, an average warpage amount in a singular point was large, indicating that warpage was significant. Furthermore, variation of warpage in a singular point was also large. In this example, the setting method D corresponds to an example of the present invention while the setting methods A to C correspond to comparable examples.

Examples 2 to 7

Prepregs having various misalignment angles were prepared as described in Example 1-(2)

In Examples 2 to 7, a fibrous base material was prepared using the materials and the process as described in Example 1, but a misalignment angle was formed differently from Example 1. The fibrous base materials in Examples 2 to 7 had a bowing region where a smaller crossing angle of warps and wefts in the fibrous base material was less than 90°, and each example had a different misalignment angle.

TABLE 3

|  | Ex. 2 | Ex. 3 | Ex. 4 | Ex. 5 | Ex. 6 | Ex. 7 |
| --- | --- | --- | --- | --- | --- | --- |
| Misalignment angle (°) | 1.0 | 0.5 | 1.5 | 0.7 | 2.0 | 2.0 |

Furthermore, laminated bodies with a copper foil having different misalignment degrees were prepared as described in Example 1-(3). There were provided six laminated bodies with a copper foil having a misalignment degree of 0.0 ° to 1.5 ° . The laminated bodies with a copper foil thus prepared were etched to form a mesh pattern on the copper foil as described in Example 1.

Each of the six laminated bodies with a copper foil was cut into 50 mm ×50 mm pieces, as a sample for warpage evaluation. For each of the laminated bodies with a copper foil having different misalignment degrees, sampling was conducted eight or more times to measure a warpage amount (μm), based on which an average and a variation coefficient were calculated. The results are shown in Table 4.

Comparative Examples 1 to 3

Laminated bodies with a copper foil were prepared as described in Example 2, except that a misalignment degree was more than 2°. There were provided three laminated bodies with a copper foil having a misalignment degree of 2.1° to 4.0°. As described in Example 2, the laminated bodies with a copper foil were measured for a warpage amount (μm), based on which an average and a variation coefficient were calculated. The results are shown in Table 4.

TABLE 4

|  | Ex. 2 | Ex. 3 | Ex. 4 | Ex. 5 | Ex. 6 | Ex. 7 | Comp. Ex. 1 | Comp. Ex. 2 | Comp. Ex. 3 |
|---|---|---|---|---|---|---|---|---|---|
| Misalignment degree (°) | 0.0 | 0.3 | 0.5 | 0.7 | 1.0 | 1.5 | 2.1 | 3.5 | 4.0 |
| Average warpage amount (μm) | 94 | 99 | 98 | 102 | 120 | 94 | 209 | 226 | 201 |
| Variation coefficient | 0.31 | 0.36 | 0.4 | 0.42 | 0.33 | 0.24 | 0.37 | 0.43 | 0.40 |

Table 4 shows that the smaller a misalignment degree was, the smaller warpage was and the smaller an average warpage amount was. In contrast, with a misalignment degree of 2.1° or more, an average warpage amount was large. Furthermore, a variation coefficient for a warpage amount was relatively larger with a misalignment degree of 2.1 or more, indicating poor dimensional stability.

The above results demonstrate that warpage in a laminated body can be reduced by controlling a misalignment degree.

Again, in Examples 2 to 7, the warps in one prepreg and in the other prepreg were aligned in their extension direction and mutually parallel in the regions other than the bowing region in a plan view of the laminated body. Likewise, wefts in one prepreg and in the other prepreg were aligned in their extension direction and mutually parallel.

The invention claimed is:

1. A laminated body comprising a first resin layer including a first fibrous base material and a resin and a second resin layer including a second fibrous base material and a resin,
wherein said first resin layer and said second resin layer are disposed such that at least a part of said first resin layer and at least a part of said second resin layer are positioned in separate regions separated by a center line in a thickness direction of said laminated body;
wherein each of said first fibrous base material and said second fibrous base material has a bowing region where the bowing region is a region in which a smaller warp/weft crossing angle is less than 89° in said first and second fibrous base materials;
wherein said first fibrous base material and said second fibrous base material are disposed such that the bowing regions of said first fibrous base material and said second fibrous base material overlap;
wherein in said bowing region, the larger angle among an angle formed by a warp of said first fibrous base material and a warp of said second fibrous base material and an angle formed by a weft of said first fibrous base material and a weft of said second fibrous base material is 2° or less, and
wherein a thickness of said laminated body is 0.2 mm or less.

2. The laminated body as claimed in claim 1, wherein said first and said second resin layers are substantially symmetrically disposed around the center line in a thickness direction of said laminated body.

3. The laminated body as claimed in claim 1, wherein said first and said second resin layers are the outermost layers in said laminated body.

4. The laminated body as claimed in claim 1, wherein all of the fibrous base materials contained in said laminated body comprise a bowing region, and between all the fibrous base materials, an angle formed by warps of said fibrous base materials and an angle formed by wefts of said fibrous base materials, whichever is larger, is 2° or less.

5. The laminated body as claimed in claim 1, wherein a linear expansion coefficient of said laminated body in a planar direction is 2 ppm/° C. or more and 20 ppm/° C. or less.

6. The laminated body as claimed in claim 1, wherein assuming that for said laminated body, an elastic modulus at 30° C. is A [GPa] and an elastic modulus at 180° C. is B [GPa], the equation is satisfied:

$$0.05 \le (A-B)/A \le 0.5.$$

7. The laminated body as claimed in claim 1, wherein at least one of said first fibrous base material and said second fibrous base material is a glass cloth.

8. The laminated body as claimed in claim 1, wherein a thickness of at least one of said first fibrous base material and said second fibrous base material is 0.01 mm or more and 0.15 mm or less.

9. The laminated body as claimed in claim 1, wherein
in a plan view of said laminated body, in the regions other than said bowing region, a warp of said first fibrous base material and a warp of said second fibrous base material are aligned in their extension direction and mutually parallel and
a weft of said first fibrous base material and a weft of said second fibrous base material are aligned in their extension direction and mutually parallel.

10. A laminated body with a metal foil comprising the laminated body as claimed in claim 1, and a metal foil on at least one surface of said laminated body.

11. The laminated body with a metal foil as claimed in claim 10, wherein said metal foil is a copper foil.

12. A circuit board comprising the laminated body as claimed in claim 1.

13. A semiconductor package, wherein a semiconductor device is mounted on the circuit board as claimed in claim 12.

14. A process for manufacturing a laminated body, comprising the steps of:
providing a first resin layer including a first fibrous base material and a resin and a second resin layer including a second fibrous base material and a resin;
disposing said first resin layer and said second resin layer such that at least a part of said first resin layer and at least a part of said second resin layer are positioned in separate regions separated by the center line in a thickness direction of said laminated body;

laminating said first resin layer and said second resin layer directly or via another layer; and heating and pressing said first resin layer and said second resin layer to form a laminated body, wherein each of said first fibrous base material and said second fibrous base material has a bowing region, where the bowing region is a region in which a smaller warp/weft crossing angle is less than 89° in said first and second fibrous base materials;

wherein in the step of laminating said first resin layer and said second resin layer, said first fibrous base material and said second fibrous base material are disposed such that the bowing regions of said first fibrous base material and said second fibrous base material overlap, and said first resin layer and said second resin layer are laminated such that in said bowing region, the larger angle among an angle formed by a warp of said first fibrous base material and a warp of said second fibrous base material and an angle formed by a weft of said first fibrous base material and a weft of said second fibrous base material is 2° or less.

15. The process for manufacturing a laminated body as claimed in claim 14, wherein in the step of disposing said first resin layer and said second resin layer, said first resin layer and said second resin layer are substantially symmetrically disposed around the center line in a thickness direction of said laminated body.

16. The process for manufacturing a laminated body as claimed in claim 14, wherein in the step of disposing said first resin layer and said second resin layer, said first resin layer and said second resin layer are disposed such that said layers are the outermost layers in said laminated body.

17. The process for manufacturing a laminated body as claimed in claim 14, wherein in the step of preparing said first resin layer and said second resin layer, at least one additional resin layer including a fibrous base material and a resin is prepared, and in the step of laminating said first resin layer and said second resin layer, all the resin layers are laminated such that between all the fibrous base materials, an angle formed by warps of said fibrous base materials and an angle formed by wefts of said fibrous base materials, whichever is larger, is 2° or less for all the fibrous base materials.

18. The process for manufacturing a laminated body as claimed in claim 14, wherein a thickness of at least one of said first fibrous base material and said second fibrous base material is 0.01 mm or more and 0.15 mm or less.

19. A process for manufacturing a laminated body with a metal foil, comprising the step of forming a metal foil at least one surface of said laminated body prepared by the manufacturing process as claimed in claim 14.

* * * * *